June 22, 1971 A. U. MacRAE 3,586,542
SEMICONDUCTOR JUNCTION DEVICES
Filed Nov. 22, 1968
FIG. 1
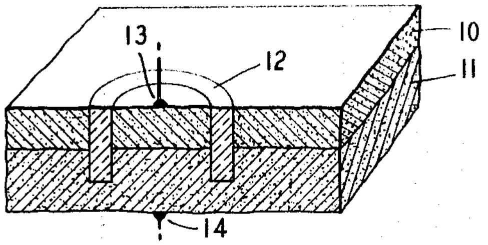
FIG. 2
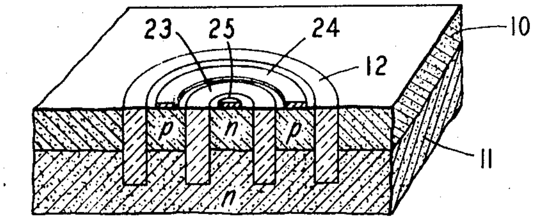
FIG. 3
FIG. 3, FIG. 4
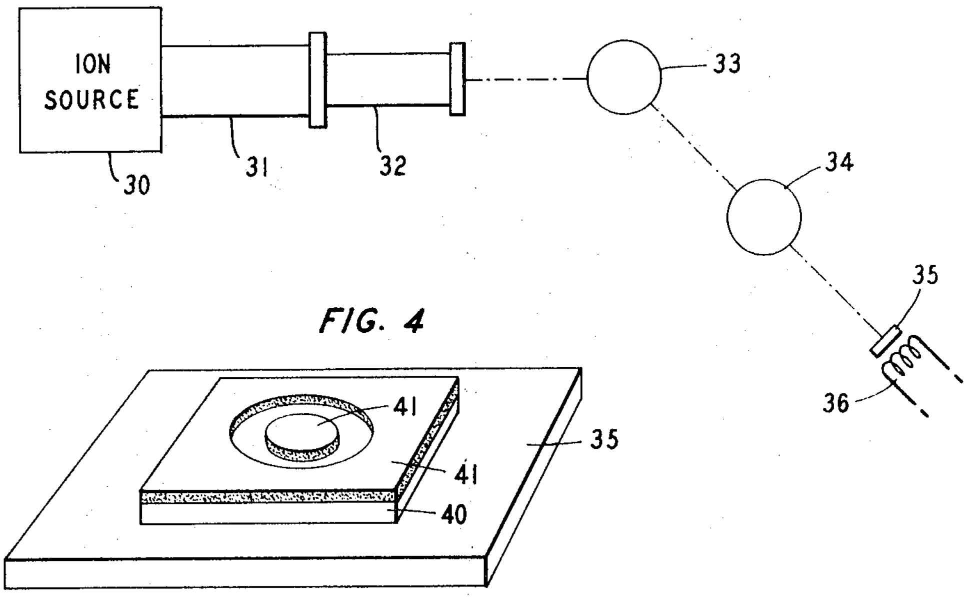
FIG. 5
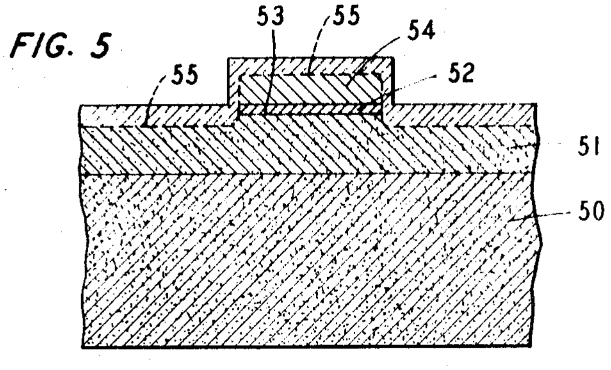
INVENTOR
A. U. MAC RAE
BY [signature]
ATTORNEY United States Patent Office 3,586,542

Patented June 22, 1971

3,586,542
SEMICONDUCTOR JUNCTION DEVICES

Alfred U. MacRae, Berkeley Heights, N.J., assignor to Bell Telephone Laboratories, Incorporated, Murray Hill and Berkeley Heights, N.J.

Filed Nov. 22, 1968, Ser. No. 778,285
Int. Cl. H01l 7/54
U.S. Cl. 148—1.5 4 Claims

ABSTRACT OF THE DISCLOSURE

The specification describes an insulating guard ring structure for seminconductive junction devices produced by implanting selected ions around the junction.

This invention relates to semiconductor devices produced by ion implantation and to methods for their manufacture.

It is known that various semiconductor junction devices exhibit enhanced electrical performance if the junction is made essentially planar. See, e.g. Bell System Technical Journal, vol. 47, No. 2, pp. 195–208 (1968). Junctions produced by conventional processing such as alloying or diffusion, ordinarily produce non-planar junctions. Furthermore, the junction intersects the substrate surface which necessitates control of the surface states around the junction by elaborately cleaning and then passivating the exposed regions. Planar junctions can be produced by employing epitaxial and diffusion techniques to form the well-known mesa structure, but here again the junction extends to the surface of the substrate. Furthermore, in the mesa structure the surface of the device is non-planar. This restricts the applicability of planar techniques for electroding, and for interconnecting multiple devices for integrated circuits.

According to the present invention these and other difficulties can be at least partially overcome by the application of ion implantation to produce an insulating interface around a barrier junction. The resulting structure contains a planar junction which is isolated from the exposed surfaces of the device.

The insulating guard ring structure especially as applied to metal-semiconductor barrier devices is treated fully in application Ser. No. 778,087, filed concurrently herewith by M. P. Lepselter and A. U. MacRae. This structure is basically novel and the procedure of this invention for obtaining this and similar guard ring structures is also novel, useful and exceedingly effective.

The invention may be more fully appreciated from a consideration of the following detailed description. In the drawing:

FIG. 1 is a perspective view with a front section of a semiconductor body incorporating a p-n junction surrounded by an insulating guard ring formed by the method of this invention;

FIG. 2 is a perspective view with a front section of a device similar to that of FIG. 1 except that provision is made for making contact to the sub-surface conductivity region;

FIG. 3 is a schematic view of an apparatus useful for carrying out the method of this invention;

FIG. 4 is a perspective view of a sample target prepared for implantation in the apparatus of FIG. 3; and FIG. 5 is a front section of a device made according to a preferred embodiment of the invention.

An exemplary device fabricated according to the invention is shown in FIG. 1. A p-n junction is formed between p-region 10 and n-region 11. The p-region can be formed in many ways known in the art such as by epitaxial deposition (by gas phase reaction, sputtering or liquid regrowth), by planar diffusion, ion implantation or by other appropriate techniques. The required objective is the formation of a planar junction below the surface of the semiconductor. The guard ring 12 which defines the boundary of the junction is formed by implanting into the semiconductor crystal by high energy bombardment atoms which form insulators with silicon. The depth of implantation must exceed the junction depth. The lateral extent of implantation is not critical. The resulting structure is a true planar junction effectively isolated from the surfaces of the device. Electrodes 13 and 14 make contact to the n- and p-regions respectively. An unusual feature of this device is the absence of a junction passivating surface layer.

FIG. 2 shows a slightly more elaborate structure containing a multiple guard ring in which provision is made for making electrical connection to the sub-surface impurity region from the top surface. Elements 10, 11 and 12 are the same as in FIG. 1 giving a diode structure with a planar junction. An insulating ring is shown implanted at 23 which also extends to a depth greater than that of the junction and which can be made in the same way as ring 12, conveniently in the same operation. An n-type impurity is then implanted selectively into the region encompassed by ring 23 to a depth exceeding the junction depth to make contact with the n-layer. Examples of n-type impurities are phosphorus and arsenic for silicon and germanium. Obviously the conductivity types can be reversed in the structures described. Electrical connections 24 and 25 can now be made to the planar surface.

The method used to implant the insulating guard ring may be standard and does not form a part of the invention. An exemplary method will be described in connection with the apparatus of FIG. 3. The implantation apparatus includes an ion source 30, for supplying appropriate ions, e.g., oxygen or nitrogen. Ion sources are described more fully in "Methods of Experimental Physics," vol. 4, pt. A, pp. 256–283 (1967). Electrostatic or magnetic lenses (not shown) focus an ion beam into an accelerating column 31, which accelerates the ions to a desired predetermined energy. The ion beam traverses a drift tube 32 which is an elongated tube evacuated to a pressure of the order of $10^{-6}$ torr, then passes through a mass separation magnet 33 which removes ion impurities from the beam. The beam direction is controlled by an *x-y* deflector 34 which directs the beam onto a desired region of target 35.

The target is shown in detail in FIG. 4. The semiconductor body containing the rectifying junction is designated 40. A mask, which can be formed by standard photoresist techniques, is indicated by 41. The region exposed by the mask permits the formation of the insulating guard ring, e.g., the ring 12 of FIG. 1. The mask 41 must be thick enough to prevent penetration of the ion beam to the underlying silicon. The substrate is shown mounted on a target support 35 which is composed of a material stable under the conditions necessary to effect implantation, e.g. stainless steel or molybdenum.

A means for heating the substrate to continuously anneal out radiation damage is shown at 36 in FIG. 3 and is known to be an advantageous and often necessary accessary. For implanting oxygen into silicon it is desirable to maintain a substrate temperature of at least 650° C. during implantation.

The ion beam must penetrate into the semiconductor to a depth exceeding the depth of the junction. This depth may vary from a few hundred angstroms in the case of a surface barrier device to several microns for a diffused p-n junction device. The conditions for forming such layers may vary considerably. However, as a specific example, a $SiO_2$ layer in silicon, approximately $1\mu$ thick, can be grown by using a ramp voltage from 300 kev. to zero kev. with a total or integrated exposure of approximately 1 amp. sec./cm.$^2$. Insulating regions for the implanted region can thus be obtained.

Various ions can be selected for implantation to form the insulating guard ring. In the case of the most commonly used semiconductors (Si, Ge, and the III–V semiconductors) oxygen, nitrogen, carbon, and mixtures thereof are especially suitable. The resistivity of the implanted guard ring should exceed the resistivity of the active semiconductor region by at least two orders of magnitude.

The invention is applicable to many forms of devices in which planar junctions or barrier layers are useful. Whereas FIG. 1 is described above in terms of a p-n junction between layers 10 and 11, the same geometry could be used to form a planar Schottky barrier between a metal layer 11 and a semiconductor body 10. The planar interface in this device results in "hard" reverse breakdown characteristics and this is an important feature. A sharp breakdown with attendant reduction in leakage current (which typically occurs along the non-planar regions of the barrier) permits the diode to be used for high power rectification and improves its switching and oscillation characteristics. Thus the term "barrier layer" when used in the broad context of junction devices is intended to include surface barrier junctions as well. A barrier layer for the purpose of this invention is best described as a boundary between dissimilar materials which exhibits non-ohmic conduction.

A preferred embodiment in which the implantation technique of the invention is applied to the formation of an insulating guard ring around a Schottky barrier is illustrated in FIG. 5. Here an $n^+$-type silicon substrate 50 having an n-type layer 51 of ~1 ohm cm. silicon is treated to form a metal-silicide layer 52 and thus a metal silicide-silicon surface barrier 53. Techniques for forming the metal silicide are now well known but an exemplary embodiment can be described briefly as follows. A layer of a silicide-forming metal such as nickel, titanium, zirconium, hafnium or one of the six platinum group metals is deposited on the silicon substrate by evaporation, sputtering or other appropriate technique. The layer should ordinarily have a thickness of 300 A. to 3000 A. The substrate is heated to a temperature sufficient to form the silicide of the metal. This temperature will generally be in excess of 400° C., typically of the order of 700° C. As a specific case zirconium can be evaporated from a tungsten helix or carbon crucible at 1600° C. The silicide forms readily at 700° C. After the silicide is formed a metal contact 54 is applied to a selected area of the surface. This can be accomplished, for example, by evaporating a layer of metal, such as aluminum, titanium or zirconium over the surface of the silicide layer 52 and the contact region defined by selective etching according to standard photolithographic methods. The surface of the assembly at this point is exposed to oxygen ion implantation as described above. The depth of implantation is indicated by the dashed line 55 in FIG. 5. The device now consists of a metal-to-metal silicide barrier 53 guarded by an oxide guard ring. The metal contact serves as a mask during the oxidation implantation step. If the contact 54 is formed of a valve or film-forming metal its surface also becomes oxidized and thereby insulated in the process of making the guard ring. In this case the electrode wire or printed circuit should be in place prior to oxidation. The contact can also be a standard beam lead, i.e., Pt-Ti-Au, Cr-Au or similar contact material.

One of the appealing features of Schottky or surface barrier devices made with metal silicide to silicon barriers is that the junction forms below the surface of the device thus avoiding some of the surface state problems encountered when the substrate surface is used as a junction interface (e.g., in MOS devices). However, according to the technique of this invention the oxidation step necessary to form the guard ring also passivates all exposed regions and the advantage inherent in metal silicide-silicon barriers pointed out above is less vital. It now becomes practical to use ordinary metal-to-semiconductor barriers such as aluminum on silicon, palladium on germanium, gold on gallium arsenide and other combinations wherein the substrate surface is essentially the barrier interface.

Whereas the term "ring" has been used in describing the insulating structure to which the invention is directed it should be understood that the invention is not restricted to a ring shape in the conventional sense but includes any shape useful for the puropse of the invention. It is necessary only that the insulating region essentially circumscribe or isolate a portion of the planar active region. The technique can also be used to provide isolation regions in integrated circuits on large scale integration (LSI) arrays.

What is claimed is:

1. A method for making a semiconductor rectifying device having a planar surface portion and a buried coplanar rectifying barrier comprising the steps of forming a rectifying interface within a semiconductor body a portion of the interface being coplanar with the surface portion of the semiconductor body and implanting by ion bombardment of oxygen, nitrogen, carbon, or mixtures thereof a region of high resistivity extending from the surface of the semiconductor body to below the rectifying barrier and encompassing an essentially continuous region defining a perimeter around a substantial area of the coplanar portion of the rectifying interface.

2. The method of claim 1 wherein the rectifying interface is a p-n junction.

3. The method of claim 1 wherein the rectifying interface is a Schottky barrier.

4. The method of claim 1 wherein the semiconductor comprises silicon.

References Cited

UNITED STATES PATENTS

| | | | |
|---|---|---|---|
| 3,260,902 | 7/1966 | Porter | 148—175 |
| 3,390,019 | 6/1968 | Manchester | 148—1.5 |
| 3,431,150 | 3/1969 | Dolan Jr., et al. | 148—1.5 |

L. DEWAYNE RUTLEDGE, Primary Examiner

R. A. LESTER, Assistant Examiner

U.S. Cl. X.R.

117—201; 148—175, 186